United States Patent
Annepu et al.

(10) Patent No.: US 11,719,749 B1
(45) Date of Patent: Aug. 8, 2023

(54) METHOD AND SYSTEM FOR SAVING AND RESTORING OF INITIALIZATION ACTIONS ON DUT AND CORRESPONDING TEST ENVIRONMENT

(71) Applicant: Cadence Design Systems, Inc., San Jose, CA (US)

(72) Inventors: Tirumala Surya Prasad Annepu, Bangalore (IN); Shai Fuss, Petah Tikva (IL); Zeev Kirshenbaum, Shoham (IL)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 240 days.

(21) Appl. No.: 17/076,850

(22) Filed: Oct. 22, 2020

(51) Int. Cl.
*G01R 31/317* (2006.01)
*G06F 30/20* (2020.01)
*G06F 9/4401* (2018.01)

(52) U.S. Cl.
CPC .... *G01R 31/31718* (2013.01); *G01R 31/31704* (2013.01); *G06F 9/4406* (2013.01); *G06F 30/20* (2020.01)

(58) Field of Classification Search
CPC ......... G01R 31/31718; G01R 31/31704; G06F 9/4406; G06F 30/20
See application file for complete search history.

(56) References Cited

U.S. PATENT DOCUMENTS

| | | | | |
|---|---|---|---|---|
| 7,536,742 B2* | 5/2009 | Schlosser | B08B 9/0557 | 15/104.062 |
| 10,846,449 B1* | 11/2020 | Suresh et al. | G06F 30/343 | |
| 11,226,370 B1* | 1/2022 | Mendelson et al. | G06F 11/3688 | |
| 2003/0131325 A1* | 7/2003 | Schubert et al. | G06F 30/33 | 716/106 |
| 2003/0171908 A1* | 9/2003 | Schilp et al. | G06F 30/33 | 703/16 |
| 2003/0217343 A1* | 11/2003 | Rajsuman et al. | G01R 31/318314 | 700/121 |
| 2012/0226952 A1* | 9/2012 | Katz et al. | G06F 11/261 | 714/726 |
| 2013/0151831 A1* | 6/2013 | Bealkowski et al. | G06F 9/45533 | 713/2 |
| 2016/0321167 A1* | 11/2016 | Shah et al. | H04W 4/50 | |
| 2017/0170956 A1* | 6/2017 | Cipu et al. | H04L 9/0841 | |
| 2021/0025938 A1* | 1/2021 | Pöppe et al. | G01R 31/31905 | |
| 2022/0247853 A1* | 8/2022 | Mitchell et al. | H04M 1/24 | |

OTHER PUBLICATIONS

"Bare-metal Boot Code for ARMv8-A Processors", Document Number: ARM DAI 0527A Copyright © 2017 ARM. All rights reserved pages 1-53.
Intel Arria® 10 SoC Boot User Guide, ID: 683735 Version: 2019.04.03 Pages 1-44.

* cited by examiner

*Primary Examiner* — Mohammad K Islam
(74) *Attorney, Agent, or Firm* — Pearl Cohen Zedek Latzer Baratz LLP

(57) ABSTRACT

A computer implemented method may include executing a first simulation test for testing a device under test (DUT) and a corresponding test environment; saving a snapshot image of the DUT and of the corresponding test environment upon completion of initialization actions included in the first simulation test to configure the DUT; compiling a DUT part of a second simulation test into the saved snapshot image of the DUT to obtain a restore image for the DUT; loading the restore image of the DUT and restoring the snapshot image of the test environment; loading a test environment part of the second simulation test; and executing the second simulation test on the DUT and corresponding test environment.

20 Claims, 4 Drawing Sheets

METHOD AND SYSTEM FOR SAVING AND RESTORING OF INITIALIZATION ACTIONS ON DUT AND CORRESPONDING TEST ENVIRONMENT

FIELD OF THE INVENTION

The present invention relates to verification of electronic designs. More specifically the present invention relates to method and system for saving and restoring initialization actions on a device under test (DUT) and corresponding test environment, allowing using restored initialization actions as a starting point to run new tests on the DUT and test environment.

BACKGROUND OF THE INVENTION

Design verification is a common process for testing a newly designed integrated circuit, board, or system-level architecture, to, for example, confirm that it complies with the requirements defined by the specification of the architecture for that device.

Functional verification of electronic designs typically has three forms. At an early stage, before the electronic design is implemented in hardware, simulation can be conducted on a model of the design. Another form can be emulation, in which one electronic hardware is used to mimic the behavior of another (tested) electronic hardware. At more advanced stages of design development, a system on a chip can be validated, in a process which is typically referred to as post-silicon verification. Post-silicon verification can be a last stage in the electronic design development, for example, after manufacturing.

Another form of verification is formal verification, which rather than testing a DUT, can be aimed at proving or disproving the correctness of a given logic with respect to a certain formal specification, using formal methods of mathematics.

System-level tests that may be executed during simulation on actual embedded cores can take extremely long time to complete due to the sheer size of the DUT and amount of operations needed to be performed for any simulation run, which may result in limited throughput and a long turn-around cycle for debug and development. If a simulation process involves separate sessions, at the end of a session a current state may have to be stored, and when a later simulation session resumes the simulation process that current state may need to be restored first before proceeding with the simulation tests. Modern simulators may include a mechanism to save a current simulation state and restore it at a later simulation session.

When an electronic system restarts various initialization routine actions and checks may take place. For example, configuration of devices of the electronic system may be carried out, and new test code may be loaded into memory for the DUT to be executed. Similarly, when shutting down an electronic system various shutdown routine actions may be performed to ensure proper shutdown. For example, data (e.g., in volatile or non-volatile memory) may be saved before completing the shutdown.

While such routine actions can take little time to complete in the final product, in simulation such routine actions may take very long time (e.g., 2-3 hours) to complete. System-level tests that are generated and executed in simulation on actual embedded cores can take an extremely long time to simulate due to the sheer size of the tested system and amount of operations needed to be performed for any meaningful software run. This may result in limited throughput and long turnaround cycle for debug and development.

There are known Electronic Design Automation (EDA) tools for performing simulation that can save a current state of a simulation carried out on a DUT, that can allow a verification expert (also referred hereinafter as "user" for brevity) to upload the saved current state of a simulation run and resume running that simulation from that saved state. It may be possible to skip initialization routine action by saving a current state after initialization routine actions are completed, but resuming a specific simulation, which includes specific test or tests, from a saved state can be useful only in some cases, such as when the user wants to repeat a specific run for debug.

Existing functional verification techniques typically focus on only one aspect of the combined system being tested - on the DUT or on the test environment (testbench). The simulator can save and later restore a snapshot image of the hardware state of the DUT or save executed testbench processes. Existing verification flows are typically sensitive to changes in the code base of both of the embedded cores software (the simulated DUT) and the host testbench software, and typically do not allow new or modified test code on top of an existing snapshot image that is restored.

It may be desired to handle a full system-level flow which requires that after restore new test software is loaded for the embedded cores (of the DUT) as well as for the host testbench, and reestablishing synchronization between the DUT and the testbench. It may be also desired, when a different test scenario needs to be executed after restoring the system state from a saved state, to replace the test code in the DUT and the testbench. This can allow users to run the initialization sequence only once, and then reuse it from a saved state for other different tests, making the latter tests significantly shorter in simulation time.

SUMMARY OF THE INVENTION

There is thus provided, according to some embodiments of the present invention, a computerized method. The method may include, using a computer, executing a first simulation test for testing a DUT and a corresponding test environment. The method may also include, using the computer, saving a snapshot image of the DUT and of the corresponding test environment upon completion of initialization actions included in the first simulation test to configure the DUT. The method may also include, using the computer, compiling a DUT part of a second simulation test into the saved snapshot image of the DUT to obtain a restore image for the DUT. The method may also include, using the computer, loading the restore image of the DUT and restoring the snapshot image of the test environment. The method may also include using the computer, loading a test environment part of the second simulation test. The method may also include using the computer, executing the second simulation test on the DUT and corresponding test environment.

In accordance with some embodiments of the present invention, loading the test environment part of the second simulation test comprises using a shared object that includes the test environment part of the second simulation test.

In accordance with some embodiments of the present invention, the method may also include obtaining from a user a bare metal boot code and using the bare metal boot code when loading the restore image of the DUT.

In accordance with some embodiments of the present invention, synchronization between the DUT and test environment initialization actions is performed using a built-in inter-process and inter-executable communication mechanism.

In accordance with some embodiments of the present invention, the method may also include obtaining from the user one or more changes to one or more scripts used to compile or run a simulation.

In accordance with some embodiments of the present invention, saving the snapshot image of the DUT and of the corresponding test environment comprises executing a save command on an embedded core of the DUT to trigger the saving of the snapshot image, and delaying saving of the snapshot image until after the initialization actions have ended on all other embedded cores and testbench environment.

In accordance with some embodiments of the present invention, The method may include saving the snapshot image of the DUT and of the corresponding test environment comprises executing a save command on the test environment to trigger the saving of the snapshot image, and delaying saving of the snapshot image until after the initialization actions have ended on embedded cores of the DUT and on the test bench environment.

In accordance with some embodiments of the present invention, the method may include stopping simulation of the first simulation test.

In accordance with some embodiments of the present invention, a system is provided that includes a memory and a processor, configured to compile a DUT part of a second simulation test into a saved snapshot image of a DUT and of a corresponding test environment upon completion of initialization actions included in a first simulation test to configure the DUT. The processor may also be configured to load a restore image of the DUT. The processor may also be configured to restore the snapshot image of the test environment. The processor may also be configured to load a test environment part of the second simulation test, and the processor may also be configured to execute the second simulation test on the DUT and corresponding test environment.

BRIEF DESCRIPTION OF THE DRAWINGS

In order to better understand the present invention, and appreciate its practical applications, the following figures are provided and referenced hereafter. It should be noted that the figures are given as examples only and in no way limit the scope of the invention. Like components are denoted by like reference numerals.

DETAILED DESCRIPTION OF EMBODIMENTS OF THE INVENTION

In the following detailed description, numerous specific details are set forth in order to provide a thorough understanding of the methods and systems. However, it will be understood by those skilled in the art that the present methods and systems may be practiced without these specific details. In other instances, well-known methods, procedures, and components have not been described in detail so as not to obscure the present methods and systems.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating", or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

According to some embodiments of the present invention, a method is provided for saving initialization actions executed on a DUT and a corresponding test environment and restoring the saved actions to execute a new test scenario on the DUT and the corresponding test environment.

Figure 1:
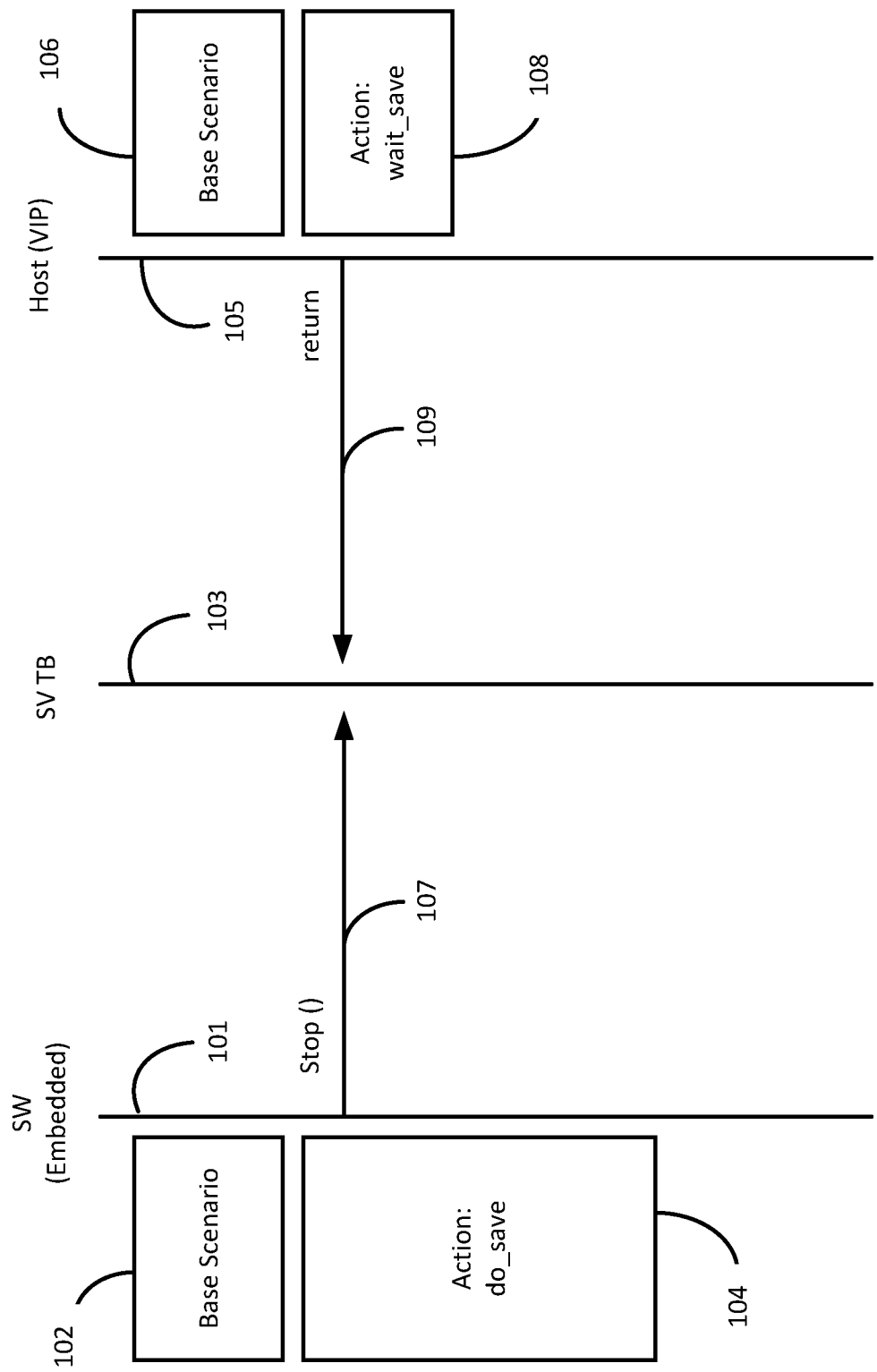
FIG. 1 is a unified modeling language (UML) sequence diagram of a save phase in a method for saving initialization actions executed on a DUT and a corresponding test environment and restoring the saved actions to execute a new test scenario on the DUT and the corresponding test environment, according to some embodiments of the present invention.

FIG. 1 is a UML sequence diagram of a save phase in a method for saving initialization actions executed on a DUT and a corresponding test environment and restoring the saved actions to execute a new test scenario on the DUT and the corresponding test environment (hereinafter also referred to as "save-restore method" for brevity), according to some embodiments of the present invention.

A save-restore method, according to some embodiments of the present invention, includes a save phase, in which a test scenario of a system level test is executed on a simulator, simulating a DUT and a corresponding test environment (also called "testbench"). Shown in this figure are exchanges between three classes - the embedded cores of the DUT 101, the simulator 103 and test environment (host verification intellectual property - VIP) 105 - over time, when running a system-level test.

Typically, a test scenario may include a base scenario which includes various initialization actions, while the rest of the test scenario includes various actions intended to test the DUT.

Some of the base scenario 102 is designed to be executed on the embedded cores of the DUT 101, and some of the base scenario 106 is designed to be executed on the test environment 105.

According to some embodiments of the invention a verification expert (hereinafter also - a "user") may indicate a point in the test scenario in which the initialization actions have been completed, before the rest of the test actions are executed. This is the point where the initialization actions of the base scenario have been completed.

According to some embodiments of the invention a user application programming interface (API) library may be provided that provides two main actions that may be applied by the user: 'save' and 'restore'.

The user may instantiate a 'save' action at the end of a base scenario of a test, when initialization (e.g., configuration) of the tested DUT and corresponding test environment is completed, getting to a state where actual test actions aimed at testing various functionalities of the DUT may commence. Similarly, the user may instantiate a 'restore' action at the beginning of a test, which focuses only on test action traffic, without handling any system configuration/bring-up. While some embodiments of the present invention described in the present specification relate to verification of electronic designs, some embodiments of the present invention may be used for software development and other tasks requiring testing, to save a snapshot of a computing system testing a software application after the initialization actions have completed, and to load onto the computing system, at a later time, the saved snapshot and a new test and run that test.

According to some embodiments of the present invention, the EDA tool may be configured to obtain from the user a bare-metal boot code for the embedded system (DUT) which is used during the restore process, and obtain from the user one or more changes to one or more scripts used to compile and/or run a simulation, to enable the save/restore steps.

The 'save' action may take care of synchronizing all embedded cores and testbench agents (VIPs), and of creating a snapshot image of the DUT and testbench, which is the state of the DUT and testbench at a certain point in time, when initialization actions of the system (including the DUT and testbench) have been completed, e.g., the system has been configured and is in a stable, idle state.

According to some embodiments of the invention, the 'save' action may include two sub-actions: 'do_save' 104 may be executed on one of the embedded cores (e.g., selected randomly) to trigger an actual save operation, and 'wait_save' 108 may be executed on all other cores/VIP agents to delay the saving of the snapshot image until after their configuration-related activity (initialization actions) has ended, signaling to the 'do_save' action that the entire system is ready. For a VIP agent, the "wait_save" command ends thread execution by the use of a return statement 109. The synchronization between the DUT and test environment initialization actions may be done using a built-in inter-process communication (IPC) and inter-executable communication mechanism of the EDA tool.

A 'do_save' action may then trigger logic in the testbench (e.g., SystemVerilog code) to complete the saving of the snapshot image and stop the original simulation test (e.g., to perform a stop command 107).

For example, in an EDA tool, for the save phase a generate command such as, -f user_env.psf -f save_phase.f -top_action base_scenario may be used, where f user_env.f: is a command to load the user environment/files. Each user may have their own different environment, -f save_phase.f may be used to load Save/Restore extra files/definitions. Such extra files may be provided by the EDA tool. Another command may be, for example, -top_action base_scenario: A predefined Save scenario - "base_scenario". Users may also create their own "base_scenario" by using a "save" action with other user actions. A command for running the Simulation and saving it as a snapshot may be: target_save/run.sh.

Figure 2:
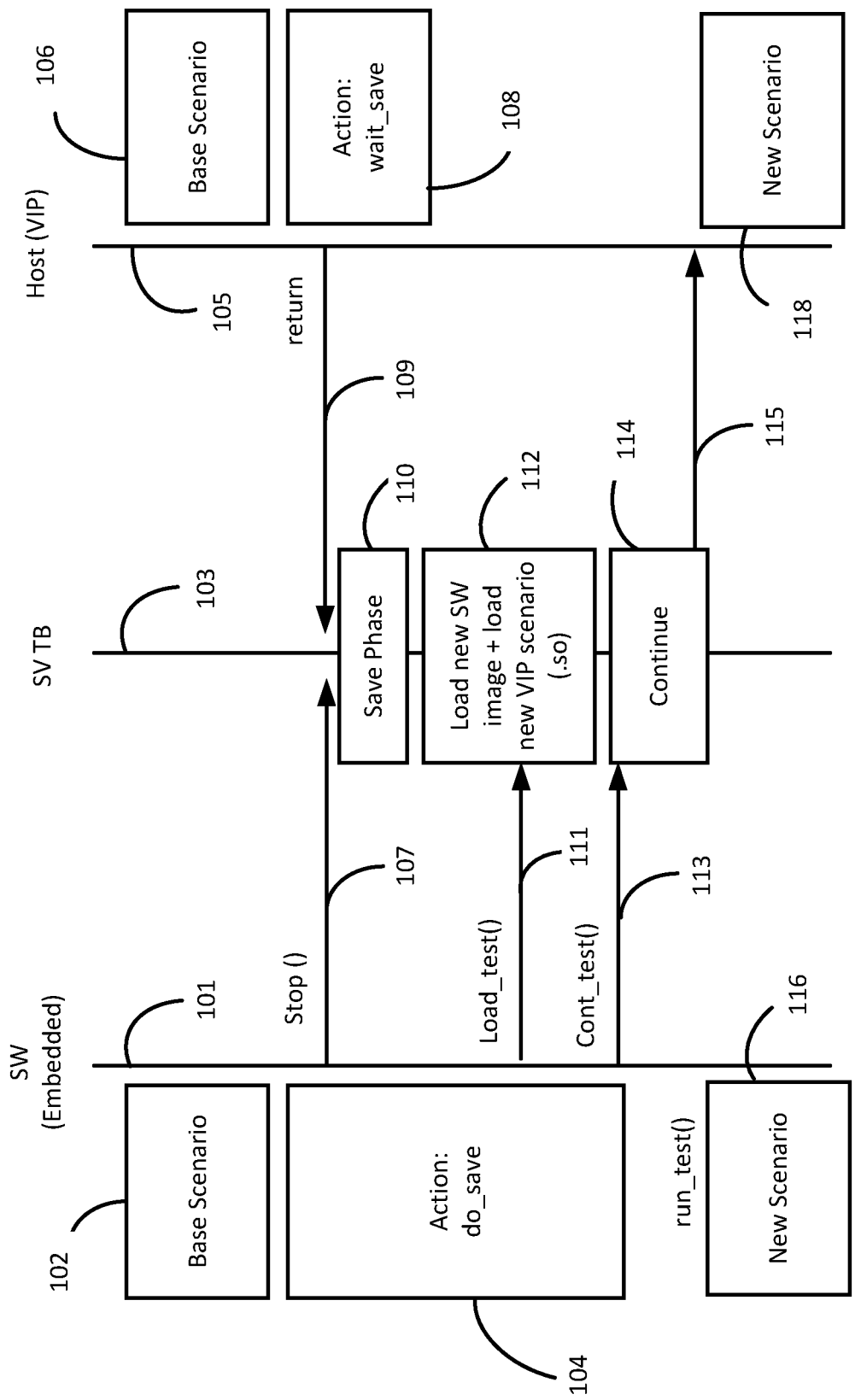
FIG. 2 is a UML sequence diagram of a restore phase in a method for saving initialization actions executed on a DUT and a corresponding test environment and restoring the saved actions to execute a new test scenario on the DUT and the corresponding test environment, according to some embodiments of the present invention.

FIG. 2 is a UML diagram of a restore phase in a method for saving initialization actions executed on a DUT and a corresponding test environment and restoring the saved actions to execute a new test scenario on the DUT and the corresponding test environment, according to some embodiments of the present invention.

According to some embodiments of the present invention it may be desired to execute a new test after restoring the simulation from the saved snapshot (that was saved in the save phase 110), such that a new test content is brought in for both the embedded software (DUT), and/or the host testbench (load new SW image and load new VIP scenario 112).

According to some embodiments of the present invention, for the embedded software (DUT), there may be two aspects involved: creation of the restore image and/orloading the restore image after the simulation is restored to the saved snapshot.

The new test may be compiled separately and loaded (load_test 111) for use as a restore image. To avoid repetition of software initialization of IPs and the DUT, the same APIs and same memory as used in the save image phase may be used. For example, a Linaro-Arm compiler may be used, which can resolve symbols (functions, global variables) that the restore image needs from the save image. This may be done, for example, using the -R<saved_image_elf> option. During the link phase, if the linker does not find some symbols in existing (restore) libraries, it may pick them from the save image and thus resolves the addresses. As a result, when the restore-image program is running, it can use the data structures and call functions that are part of the save-image, in case these are not part of the restore image.

The second aspect is the actual loading of the restore image into the embedded software memory. This may be done, for example, using a SystemVerilog (SV) $readmemh() function, but in a way so as to not overwrite any memory space already used by the embedded software. This may be handled by aligning the memory address space reserved for the restore image, between the various artifacts (C code tests, SV logic) generated for both the save and restore phases. The loading of the restore image may be triggered by the embedded software code generated by the 'restore' action. It first sends a signal to the host testbench, which in zero-time loads the new test software into memory. Then, the embedded software jumps to the memory address which holds the new test's main entry function, in effect starting the new test.

For the host VIP (testbench), a new test (e.g., in C-code) may be included in a separate shared-object (.so). The shared object may be dynamically loaded (112) after restore is initiated, e.g., using a dynamic linking loader command dlopen().

Both tests - the test that was executed during the save run and the new test to be uploaded in the restore run, may be generated using an EDA tool (e.g., a verification tool), and may share many symbols (functions and constants). Symbols in the shared-object of the new test may be explicitly referenced, e.g., using another dynamic loader command dlsym(), and invoke these symbols (functions and/or constants) explicitly to initialize and start the new test.

Once the new test scenario (for both DUT and VIP) is loaded the EDA tool may resume testing (cont_test 113, continue 114, 115), only now it is a new test scenario (the DUT test scenario 116, and the VIP scenario 118) that is being executed.

In the restore phase various commands may be used. For example, for generating the test code: -f user_env.psf -f restore_phase.f -top_action user_action, e.g., -f restore_pha se.f: to load Save/Restore extra files/definitions, -top_file user_action: Any user action to run.

For example, for restoring the save snapshot and running the new test scenario, the following command may be used: target_restore/run.sh. For example, the newly generated test is compiled and the saved snapshot can be restored. For example, any newly compiled test image may be loaded during the restore phase and executed by the DUT and Testbench.

Figure 3:
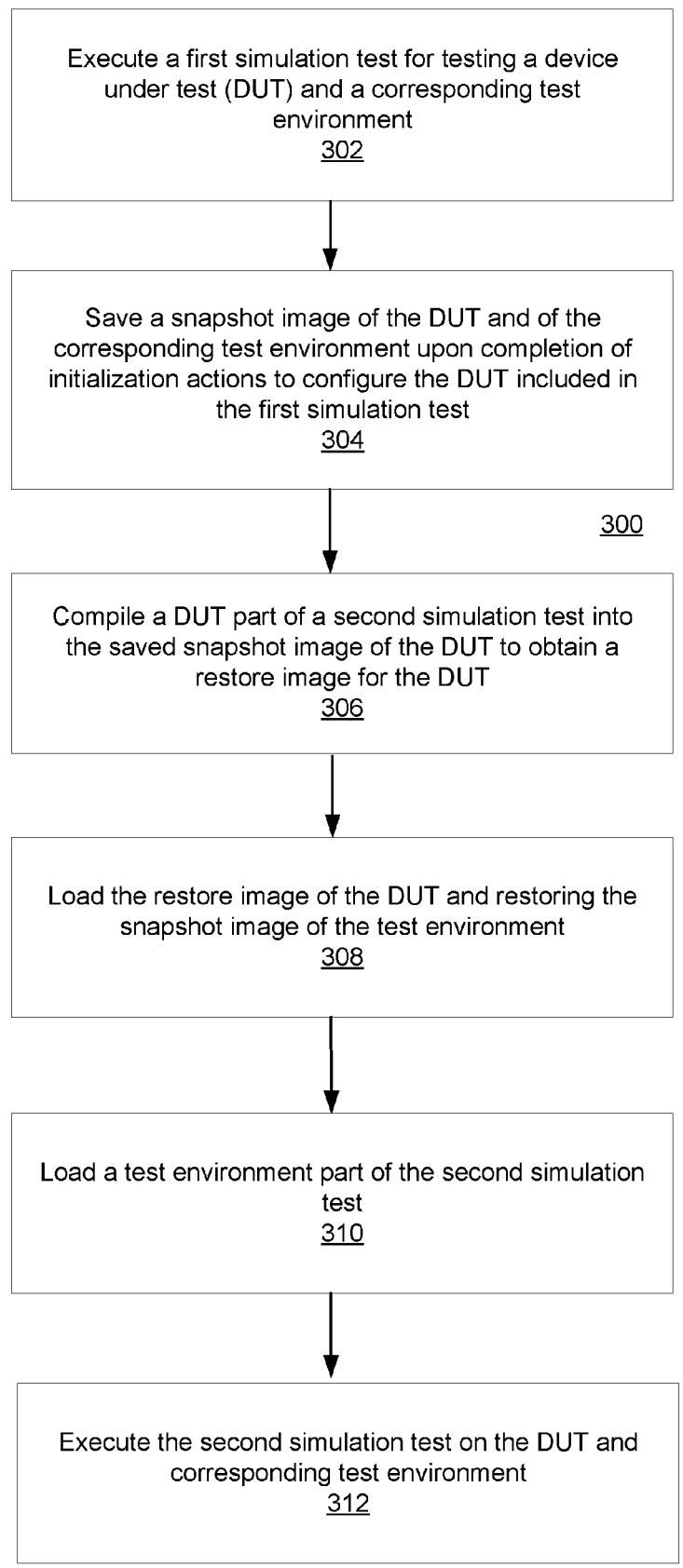
FIG. 3 is a basic diagram of a computerized method for saving initialization actions executed on a DUT and a corresponding test environment and restoring the saved actions to execute a new test scenario on the DUT and the corresponding test environment, according to some embodiments of the present invention.

FIG. 3 is a basic diagram of a method 300 for saving initialization actions executed on a DUT and a corresponding test environment and restoring the saved actions to execute a new test scenario on the DUT and the corresponding test environment, according to some embodiments of the present invention.

Method 300 may include, using a computer, executing 302 a first simulation test for testing a DUT and a corresponding test environment. The method 300 may also include, using the computer, saving 304 a snapshot image of the DUT and of the corresponding test environment upon completion of initialization actions included in the first simulation test to configure the DUT. The method 300 may also include, using the computer, compiling 306 a DUT part of a second simulation test into the saved snapshot image of the DUT to obtain a restore image for the DUT. The method 300 may also include using the computer, loading 308 the restore image of the DUT and restoring the snapshot image of the test environment. The method 300 may also include loading 310 a test environment part of the second simulation test. The method 300 may also include executing 312 the second simulation test on the DUT and corresponding test environment.

In accordance with some embodiments of the present invention, loading the test environment part of the second simulation test may include using a shared object that includes the test environment part of the second simulation test.

In accordance with some embodiments of the present invention, the method may also include obtaining from a user a bare metal boot code and using the bare metal boot code when loading the restore image of the DUT.

In accordance with some embodiments of the present invention, synchronization between the DUT and test environment initialization actions is performed using a built-in inter-process and inter-executable communication mechanism. Inter-process communication allows each of the two groups — the embedded cores, and testbench VIPs/processes — to communicate within the group. Inter-executable communication allows communication between the above two groups, so that for example an embedded core can synchronize with a VIP agent in the host testbench.

In accordance with some embodiments of the present invention, the method may also include obtaining from the user one or more changes to one or more scripts used to compile or run a simulation.

In accordance with some embodiments of the present invention, saving the snapshot image of the DUT and of the corresponding test environment comprises executing a save command on an embedded core of the DUT to trigger the saving of the snapshot image, and delaying saving of the snapshot image until after the initialization actions have ended on all other embedded cores and testbench environment.

In accordance with some embodiments of the present invention, the method may include completing the saving of the snapshot image.

In accordance with some embodiments of the present invention, the method may include stopping simulation of the first simulation test.

In accordance with some embodiments of the present invention, a system is provided that includes a memory and a processor, configured to compile a DUT part of a second simulation test into a saved snapshot image of a DUT and of a corresponding test environment upon completion of initialization actions included in a first simulation test to configure the DUT. The processor may also be configured to load a restore image of the DUT. The processor may also be configured to restore the snapshot image of the test environment. The processor may also be configured to load a test environment part of the second simulation test, and the processor may also be configured to execute the second simulation test on the DUT and corresponding test environment.

Figure 4:
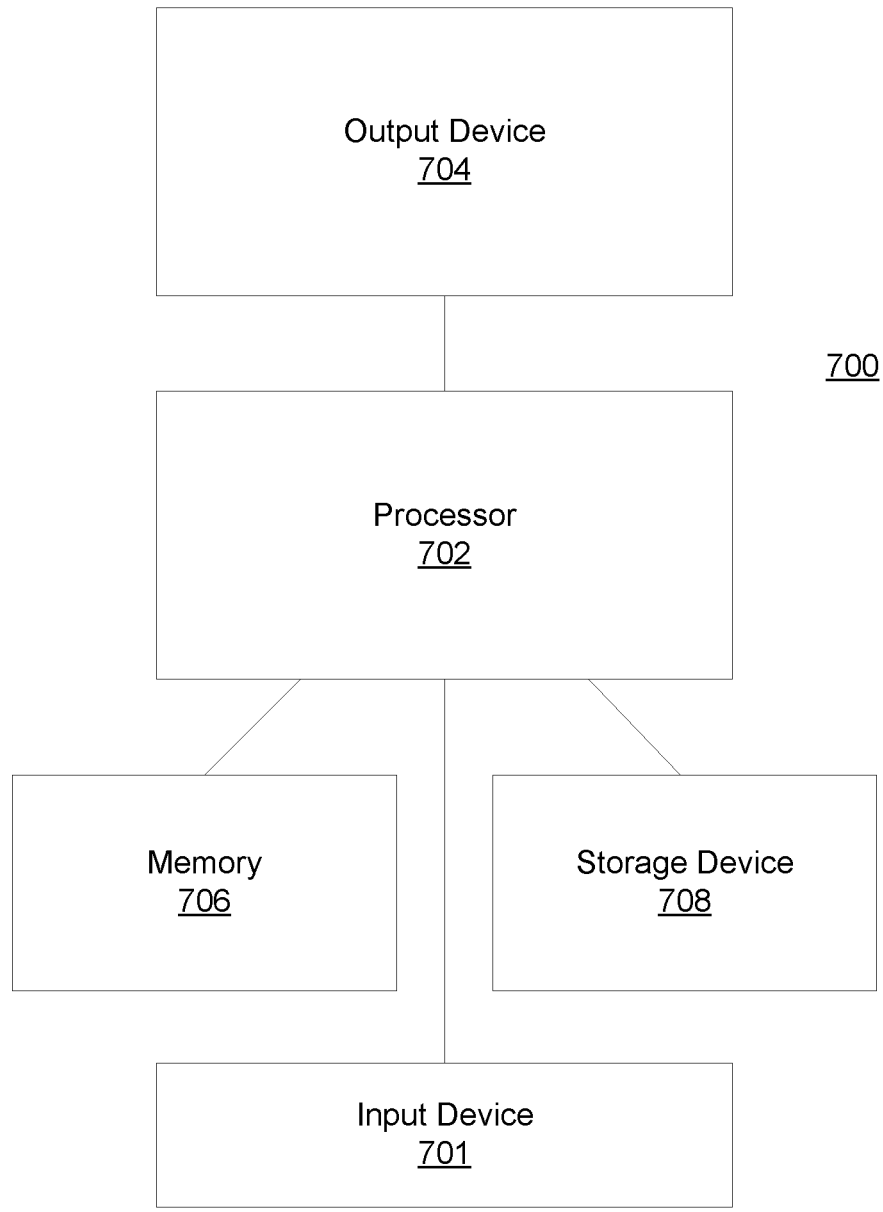
FIG. 4 shows a system for saving initialization actions executed on a DUT and a corresponding test environment and restoring the saved actions to execute a new test scenario on the DUT and the corresponding test environment, according to some embodiments of the present invention.

FIG. 4 shows a system for saving initialization actions executed on a DUT and a corresponding test environment and restoring the saved actions to execute a new test scenario on the DUT and the corresponding test environment, according to some embodiments of the present invention.

System 700 may include a processor 702 (e.g. single processor or a processing unit made that includes a plurality of processors, on a single machine or distributed on a plurality of machines) for executing a method according to some embodiments of the present invention. Processing unit 702 may be configured to perform a method according to some embodiments of the present invention and perform other actions and processing according to some embodiments of the present invention.

Processor 702 may be linked with memory 706 on which a program implementing a method according to some embodiments of the present invention and corresponding data may be loaded and run from, and storage device 708, which includes a non-transitory computer readable medium (or mediums) such as, for example, one or a plurality of hard disks, flash memory devices, etc., on which a program implementing a method according to some embodiments of the present invention and corresponding data may be stored. System 700 may further include an output device 704 (e.g. display device such as CRT, LCD, LED, OLED, etc.) on which one or a plurality user interfaces associated with a program implementing a method according to some embodiments of the present invention and corresponding data may be presented. System 700 may also include input interface 701, such as, for example, one or a plurality of keyboards, pointing devices, touch sensitive surfaces (e.g. touch sensitive screens), etc., for allowing a user to input commands and data.

Some embodiments of the present invention may be embodied in the form of a system, a method or a computer program product. Similarly, some embodiments may be embodied as hardware, software, or a combination of both. Some embodiments may be embodied as a computer program product saved on one or more non-transitory computer readable medium (or media) in the form of computer readable program code embodied thereon. Such non-transitory computer readable medium may include instructions that when executed cause a processor to execute method steps in accordance with examples. In some examples the instructions stored on the computer readable medium may be in the form of an installed application or in the form of an installation package.

Such instructions may be, for example, loaded by one or more processors and get executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer system, or on a plurality of computer systems.

Some embodiments are described hereinabove with reference to flowcharts and/or block diagrams depicting methods, systems and computer program products according to various embodiments.

Features of various embodiments discussed herein may be used with other embodiments discussed herein. The foregoing description of the embodiments has been presented for the purposes of illustration and description. It is not intended to be exhaustive or limiting to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes that fall within the true spirit of the present invention.

The invention claimed is:

1. A computerized method for saving and restoring initialization actions on a device under test (DUT) and a corresponding test environment, the method comprising:
using a computer, executing a first simulation test comprising a DUT part for testing a DUT and a test environment part for testing a corresponding test environment;
using the computer, saving a snapshot image of the DUT and of the corresponding test environment upon completion of the initialization actions to configure the DUT that are included in the first simulation test;
using the computer, compiling a DUT part of a second simulation test for testing the DUT into the saved snapshot image of the DUT to obtain a restore image for the DUT;
using the computer, loading the restore image of the DUT and restoring the snapshot image of the test environment;
using the computer, loading a test environment part of the second simulation test; and
using the computer, executing the second simulation test on the DUT and corresponding test environment.

2. The method of claim 1, wherein loading the test environment part of the second simulation test comprises using a shared object that includes the test environment part of the second simulation test.

3. The method of claim 1, further comprising obtaining from a user a bare metal boot code and using the bare metal boot code when loading the restore image of the DUT.

4. The method of claim 1, wherein synchronization between the DUT and test environment initialization actions is performed using a built-in inter-process and inter-executable communication mechanism.

5. The method of claim 1, further comprising obtaining from a user one or more changes to one or more scripts used to compile or run a simulation.

6. The method of claim 1, wherein saving the snapshot image of the DUT and of the corresponding test environment comprises executing a save command on an embedded core of the DUT to trigger the saving of the snapshot image, and delaying saving of the snapshot image until after the initialization actions have ended on all other embedded cores and test bench environment.

7. The method of claim 1, wherein saving the snapshot image of the DUT and of the corresponding test environment comprises executing a save command on the test environment to trigger the saving of the snapshot image, and delaying saving of the snapshot image until after the initialization actions have ended on embedded cores of the DUT and on the test bench environment.

8. The method of claim 7, further comprising stopping simulation of the first simulation test.

9. A system for restoring initialization actions on a device under test (DUT) and a corresponding test environment, the system comprising:
a memory and
a processor, configured to:
compile a DUT part of a second simulation test into a saved snapshot image of a DUT to obtain a restore image for the DUT and of a corresponding test environment upon completion of initialization actions to configure the DUT included in a first simulation test comprising a DUT part for testing a DUT and a test environment part for testing a corresponding test environment;
load the restore image of the DUT;
restore the snapshot image of the test environment;
load a test environment part of the second simulation test; and
execute the second simulation test on the DUT and corresponding test environment.

10. The system of claim 9, wherein the processor is configured, when loading the test environment part of the second simulation test to use a shared object that includes the test environment part of the second simulation test.

11. The system of claim 9, wherein the processor is configured to obtain from a user a bare metal boot code and using the bare metal boot code when loading the restore image of the DUT.

12. The system of claim 9, wherein the processor is configured to synchronize between the DUT and test environment initialization actions using a built-in inter-process and inter-executable communication mechanism.

13. The system of claim 9, wherein the processor is configured to obtain from a user one or more changes to one or more scripts used to compile or run a simulation.

14. The system of claim 9, wherein the processor is configured, when saving the snapshot image of the DUT and of the corresponding test environment to execute a save command on an embedded core of the DUT to trigger the saving of the snapshot image, and delaying saving of the snapshot image until after the initialization actions have ended on all other embedded cores and test bench environment.

15. The system of claim 9, wherein the processor is configured, when saving the snapshot image of the DUT and of the corresponding test environment to execute a save command on the test environment to trigger the saving of the snapshot image, and delay saving of the snapshot image until after the initialization actions have ended on embedded cores of the DUT and on the test bench environment.

16. A non-transitory computer readable storage medium for restoring initialization actions on a device under test (DUT) and a corresponding test environment, having stored thereon instructions that when executed by a processor will cause the processor to:
obtain from a user a second simulation test;
obtain a snapshot image of a DUT and of a corresponding test environment upon completion of initialization actions to configure the DUT that are included in a first simulation test;
compile a DUT part of the second simulation test into the saved snapshot image to obtain a restore image;
load the restore image of the DUT;
restore the saved snapshot image of the test environment;
load a test environment part of the second simulation test; and
execute the second simulation test on the DUT and corresponding test environment.

17. The non-transitory computer readable storage medium of claim 16, having stored thereon instructions that when executed by a processor will cause the processor, when loading the test environment part of the second simulation test to use a shared object that includes the test environment part of the second simulation test.

18. The non-transitory computer readable storage medium of claim 16, having stored thereon instructions that when executed by a processor will cause the processor to obtain from a user a bare metal boot code and using the bare metal boot code when loading the restore image of the DUT.

19. The non-transitory computer readable storage medium of claim 16, having stored thereon instructions that when executed by a processor will cause the processor to synchronize between the DUT and test environment initialization actions using a built-in inter-process and inter-executable communication mechanism.

20. The non-transitory computer readable storage medium of claim 16, having stored thereon instructions that when executed by a processor will cause the processor, when saving the snapshot image of the DUT and of the corresponding test environment to execute a save command on the test environment to trigger the saving of the snapshot image, and delay saving of the snapshot image until after the initialization actions have ended on embedded cores of the DUT and on the test bench environment.

\* \* \* \* \*